(12) United States Patent
Kuo et al.

(10) Patent No.: US 11,851,224 B2
(45) Date of Patent: Dec. 26, 2023

(54) INTEGRATED SEMICONDUCTOR DIE PARCELING PLATFORMS

(71) Applicant: Taiwan Semiconductor Manufacturing Co., Ltd., Hsin-Chu (TW)

(72) Inventors: Tsung-Sheng Kuo, Hsin-Chu (TW); Hsu-Shui Liu, Pingjhen (TW); Jiun-Rong Pai, Jhubei (TW); Yang-Ann Chu, Hsin-Chu (TW); Chieh-Chun Lin, Hsin-Chu (TW); Shine Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

(21) Appl. No.: 17/686,299

(22) Filed: Mar. 3, 2022

(65) Prior Publication Data

US 2022/0185512 A1   Jun. 16, 2022

Related U.S. Application Data

(62) Division of application No. 16/442,235, filed on Jun. 14, 2019, now Pat. No. 11,299,302.

(60) Provisional application No. 62/751,350, filed on Oct. 26, 2018.

(51) Int. Cl.
*B65B 5/04* (2006.01)
*G06T 7/00* (2017.01)
*G01N 21/95* (2006.01)
*B65G 47/28* (2006.01)

(52) U.S. Cl.
CPC ......... *B65B 5/045* (2013.01); *G01N 21/9501* (2013.01); *G06T 7/0004* (2013.01); *B65G 47/28* (2013.01)

(58) Field of Classification Search
CPC .............. G01N 21/9501; G01N 2/9501; G06T 7/0004; B65G 47/28; B65B 5/045; B65B 5/067; B65B 31/04
See application file for complete search history.

(56) References Cited

U.S. PATENT DOCUMENTS

| | | | |
|---|---|---|---|
| 10,669,054 B1 * | 6/2020 | Hoffman | B65B 59/003 |
| 10,703,521 B2 * | 7/2020 | Almogy | B65G 1/1376 |
| 2005/0227410 A1 * | 10/2005 | Colella | B65B 15/04 |
| | | | 438/106 |
| 2006/0288668 A1 * | 12/2006 | Imao | B65B 31/06 |
| | | | 53/570 |

(Continued)

*Primary Examiner* — Anna K Kinsaul
*Assistant Examiner* — Himchan Song
(74) *Attorney, Agent, or Firm* — Duane Morris LLP

(57) ABSTRACT

In certain embodiments, a system includes: an inspection station configured to receive a die vessel, wherein the inspection station is configured to inspect the die vessel for defects; a desiccant station configured to receive the die vessel from the inspection station, wherein the desiccant station is configured to add a desiccant to the die vessel; a bundle station configured to receive the die vessel from the desiccant station, wherein the bundle station is configured to combine the die vessel with another die vessel as a die bundle; and a bagging station configured to receive the die bundle from the bundle station, wherein the bagging station is configured to dispose the die bundle in a die bag and to heat seal the die bag with the die bundle inside.

9 Claims, 20 Drawing Sheets

(56) References Cited

U.S. PATENT DOCUMENTS

| | | | |
|---|---|---|---|
| 2009/0260329 A1* | 10/2009 | Ochoa | B65B 5/08 |
| | | | 53/473 |
| 2010/0230793 A1* | 9/2010 | Kudose | H01L 24/86 |
| | | | 257/E23.18 |
| 2011/0259772 A1* | 10/2011 | Forsyth | B29C 65/562 |
| | | | 206/320 |
| 2019/0315506 A1* | 10/2019 | Sun | B65B 43/265 |
| 2020/0219741 A1* | 7/2020 | Yun | H01L 21/67271 |

\* cited by examiner

INTEGRATED SEMICONDUCTOR DIE PARCELING PLATFORMS

CROSS-REFERENCE TO RELATED APPLICATION

This application is a division of U.S. patent application Ser. No. 16/442,235, filed Jun. 14, 2019, which claims priority to U.S. Provisional Patent Application No. 62/751,350, filed on Oct. 26, 2018, each of which are incorporated by reference herein in their entireties.

BACKGROUND

Modern manufacturing processes are highly automated to manipulate materials and devices and create a finished product. However, quality control, packaging, and maintenance processes often rely on human skill, knowledge and expertise for processing and inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
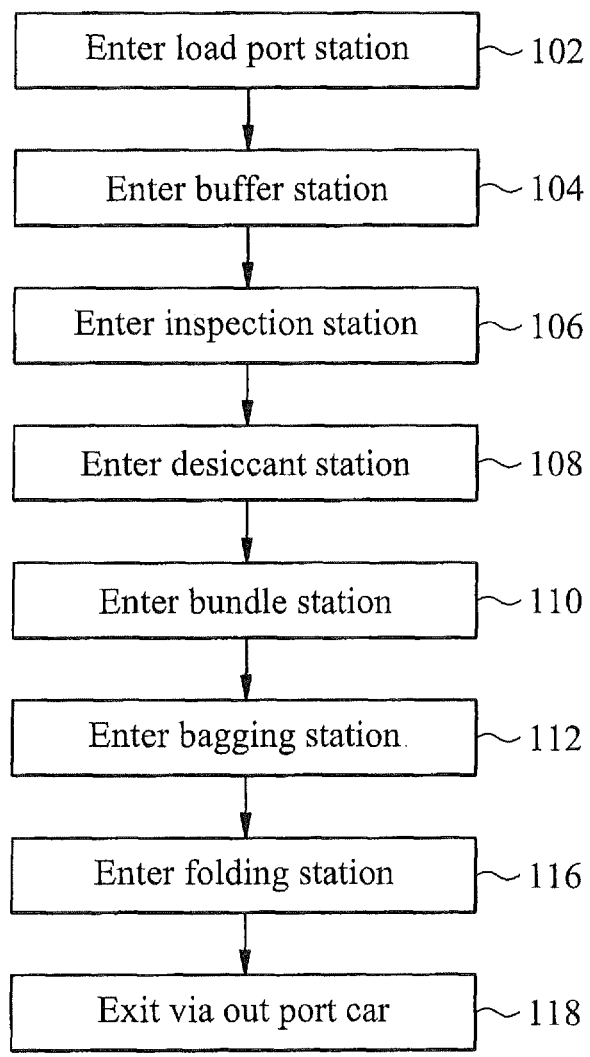
FIG. 1 is a flowchart of an integrated semiconductor die parceling process, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to an integrated semiconductor die parceling platform. Semiconductor die parceling may refer to final, or near final, packaging of a semiconductor die for delivery to a purchaser or owner of the end semiconductor die product. The semiconductor dies may be singulated dies or chips from a semiconductor wafer. The semiconductor dies may be brought to the integrated semiconductor die parceling platform in the form of a die vessel. The die vessel may be a tray, a boat, or any type of container for the transport of semiconductor dies. The die vessel may be brought to a load port station of the semiconductor die parceling platform. An inspection station of the semiconductor die parceling platform may be configured to receive the die vessel from the load port station. The inspection station may be configured to inspect the die vessel for defects related to a number of die and die quality (e.g., a quality of the die within the die vessel). A desiccant station of the semiconductor die parceling platform may be configured to receive the die vessel from the inspection station. The desiccant station may be configured to add a desiccant to the die vessel. A bundle station of the semiconductor die parceling platform may be configured to receive the die vessel from the desiccant station. The bundle station may be configured to combine the die vessel with another die vessel as a die bundle. A bagging station of the semiconductor die parceling platform may be may be configured to receive the die bundle from the bundle station. The bagging station may be configured to dispose the die bundle in a die bag, create a vacuum within the die bag; and heat seal the die bag with the die bundle in a vacuum environment. In certain embodiments, the bagging station may also be configured to print a bar code on the die bag, before, during, or after deposit of the die bundle in the die bag. A folding station of the semiconductor die parceling platform may be may be configured to receive the die bag from the barcode station. The folding station may be configured to fold the die bag into an outport car. The outport car may be moved from the integrated semiconductor die parceling platform. For simplicity of discussion, the term die container may reference an object in which dies may be transported, and may reference a die vessel, a die bundle and/or a die bag.

The integrated semiconductor die parceling platform may provide an integrated platform where each station is connected with another in an automated fashion. Each station may be a stationary point or location for processing a die container, from the initial load port station to the final folding station. Accordingly, die containers (e.g., die vessels) need only be brought to a load port station of the integrated semiconductor die parceling platform to be processed. Then, the die vessels may be inspected, bundled, bagged, labeled, and then placed in an out port car for transport from the integrated semiconductor die parceling platform, all without manual or human intervention by an operator of the integrated semiconductor die parceling platform.

In various embodiments, each station of the integrated semiconductor die parceling platform may be interconnected via a conveyor system. The conveyor system may describe the automated interconnections between the stations to bring the die containers (e.g., die vessels, die bundles, and/or die bags) from one station to another. In certain embodiments, the conveyor system may include a system of robotic arms and conveyor belts configured to receive the die vessels at one station and to move the die vessels for receipt (e.g., processing) at another station.

The die vessel may be made of any type of material suitable for semiconductor die transport, such as a plastic or a metal. In certain embodiments, the die vessel may be referred to as a tray or a boat. Also, in particular embodiments, the die vessel may include a number of concave receptacles (e.g., pockets) in which individual dies may be placed (e.g., housed). These dies may be, optionally, further adhered in place in virtue of rotatable pin that may contact a top surface of a die while the die rests with a bottom surface on the die vessel.

FIG. 1 is a flowchart of an integrated semiconductor die parceling process, in accordance with some embodiments. The integrated semiconductor die parceling process may be performed by an integrated semiconductor die parceling platform. It is noted that the process 100 is merely an example, and is not intended to limit the present disclosure. Accordingly, it is understood that additional operations may be provided before, during, and after the process 100 of FIG. 1, certain operations may be omitted, certain operations may be performed concurrently with other operations, and that some other operations may only be briefly described herein.

At operation 102, a die vessel may be brought to a load port station. The load port station may be a point of entry for the integrated semiconductor die parceling platform. This point of entry may be configured to interface with, for example, an automated material handling system or by manual handling (e.g., deposit) of the die vessel to the load port station. As noted above, the die vessel may include multiple semiconductor dies that are arranged on the die vessel. Accordingly, depositing the die vessel in the load port station may also deposit the constituent semiconductor dies that are in (e.g., resting on) the die vessel. Further discussion of die vessels will be provided below. In certain embodiments, the load port station may have multiple load port shelves (e.g., be configured to receive more than one die vessel at a time). For example, the integrated semiconductor die parceling platform may have two or three load port shelves so as to receive two or three die vessels at a same time.

In various embodiments the load port station may be interfaced with a conveyor system of the integrated semiconductor die parceling platform. The conveyor system may be an automated system for moving die containers (e.g., die vessels, die boats, and die bags) within the integrated semiconductor die parceling platform between stations. For example, the conveyor system may include various conveyor belts and robotic arms. These conveyor belts may be disposed between stations and the robotic arms may, as necessary, move the die containers to and from the conveyor belt and stations.

At operation 104, the die vessel may enter a buffer station. The buffer station may be a temporary repository of die vessels. In various embodiments, the buffer station may include a number of shelves on which different die vessels may be placed, with each separated vertically from the other. The die vessels may be taken to the buffer station and from the buffer station via the conveyor system of the integrated semiconductor die parceling platform.

At operation 106, the die vessel may enter an inspection station. The conveyor system may bring the die vessel from the buffer station to the inspection station. The inspection station may be configured to inspect the die vessels for defects. These defects may be defects of the die vessel itself and/or the constituent semiconductor dies. For example, the inspection station may be configured to inspect the die vessel for a defects, such as lack of an expected number of semiconductor dies on the die vessel. The inspection station may also be configured to inspect the semiconductor dies on the die vessels, such as to detect whether the semiconductor dies are of a correct size and/or if they have an unexpected surface feature or non-uniformity. In various embodiments, the inspection station may include an image sensor configured to capture image data of semiconductor dies on a die vessel at known (e.g., predetermined or expected) locations on the die vessel. This image data may be analyzed to determine whether there is a defect. A remediation step may be performed if there is a defect, such as by moving the defective die vessel associated with the defect (e.g., defect at the die vessel or at an individual semiconductor die) to a particular area of the integrated semiconductor die parceling platform for remediation and/or stopping the processing of the defective die vessel on the integrated semiconductor die parceling platform. Alternatively, the conveyor may move the die vessel from the inspection station should no defect be detected.

At operation 108, the die vessel may enter a desiccant station. The conveyor system may move the die vessel to the desiccant station from the inspection station. The desiccant station may include a mechanism to add a desiccant to the die vessel. The desiccant may be a hygroscopic substance that induces or sustains a state of dryness in its vicinity, such as a solid that absorbs water. This mechanism may be, for example, a robotic arm or an overhead depositor that may deposit the desiccant on the die vessel. In certain embodiments, each die vessel may receive a desiccant. However, in other embodiments, only one die vessel within a die bundle may receive a desiccant. Accordingly, only certain die vessels (e.g., not all die vessels) may receive a desiccant.

At operation 110, the die vessel may enter a bundle station. The conveyor system may move the die vessel from the desiccant station to the bundle station. At the bundle station, the die vessel may be bundled with other die vessels as a die bundle. This die bundle may include a predetermined number of die vessels stacked on top of the other and then secured together via a harness. The harness may be moved over the stacked die vessels and then tightened over the stacked die vessels to adhere the die vessels together. In certain embodiments, a robotic arm system of one or more robotic arms or other manipulators at the bundle station may take individual die vessels, stack them on each other, and then secure them together using the harness. Then, the die bundle, including multiple die vessels, may be moved via the conveyor system to another station. In certain embodiments, the harness may have a bundling tension (e.g., string tension) of about 15 to about 20 kilograms and a width of about 12 millimeters or greater.

At operation 112, the die bundle may enter a bagging station. The conveyor system may move the die bundle from the bundle station to the bagging station. The bagging station may be configured to place the die bundle into a container, such as a bag or a box. For example, the bagging station may be configured to place the die bundle into a bag. In certain embodiments, the bag may be substantially made of aluminum. The bagging station may have access to a bag stack of bags, from which a bagging station manipulator system may be configured to remove and open a single one of the bags for deposit of the die bundle. After die bundle deposit, the bagging station may be configured to remove the gas in the bag via a suction conduit to create a vacuum environment. In certain embodiments, this suction conduit may be made of multiple constituent tubes, adhered together, that make up the suction conduit. In certain embodiments, the suction force at each of the multiple constituent suction tubes may be around 30 pounds per square inch (PSI). Then, once the gas is removed and a vacuum environment is created in the bag, the bagging station may be configured to seal the bag. The bag may be sealed by application of heat to melt some of the bag material to create a seal. For example, the bag may be made of aluminum, such that heat may be applied to part of the aluminum to melt the aluminum and seal the bag. In certain embodiments, the heat applied may be from about 80 to about 250 degrees centigrade and the width of the seal may be greater than 10 millimeters. For ease of explanation, a die bag may also refer to the entirely of a bag with a die bundle inside. In certain embodiments, the bagging station may include a barcode printer configured to label bags either before, during, or after the die bundles are inserted within the bags. These labels may be a barcode label indicating information associated with the die bag. For example, these labels may characterize the dies within the die bag.

At operation 116, the die bag may enter a folding station. The conveyor system may bring the die bag from the bagging station to the folding station. The folding station may be configured to fold the die bag and move the die bag into an out port car. The out port car may include a number of shelves on which on which different die bags may be placed, with each separated vertically from the other. Each die bag may be folded at the folding station so that the bag may fit within a respective shelf of the out port car. The folding and deposit of the die bags onto the out port car may be performed by an out port car processing manipulator system which may include at least one robotic arm configured to take a die bag from the conveyor and to place the die bag onto a respective shelf of the out port car. In certain embodiments, the out port car processing manipulator system may also be configured to fold each die bag so as to reduce the size of the die bag and so that the die bag may fit within a shelf of the out port car. For example, the out port car processing manipulator system may be configured to fold the die bag to tuck excess material on the die bag against a solid surface of the die bag (in virtue of the die bundle within the die bag). Then, this folded die bag may be deposited onto a shelf of the out port car. In certain embodiments, the folding station may fold the die bags but the conveyor system may place the die bags on the out port car.

At operation 118, the out port car may move die bags away from the integrated semiconductor die parceling platform. In addition to having shelves to store die bags, the out port car may include wheels in which the out port car may be wheeled (e.g., pushed or pulled) away from the semiconductor die parceling platform.

Figure 2A:
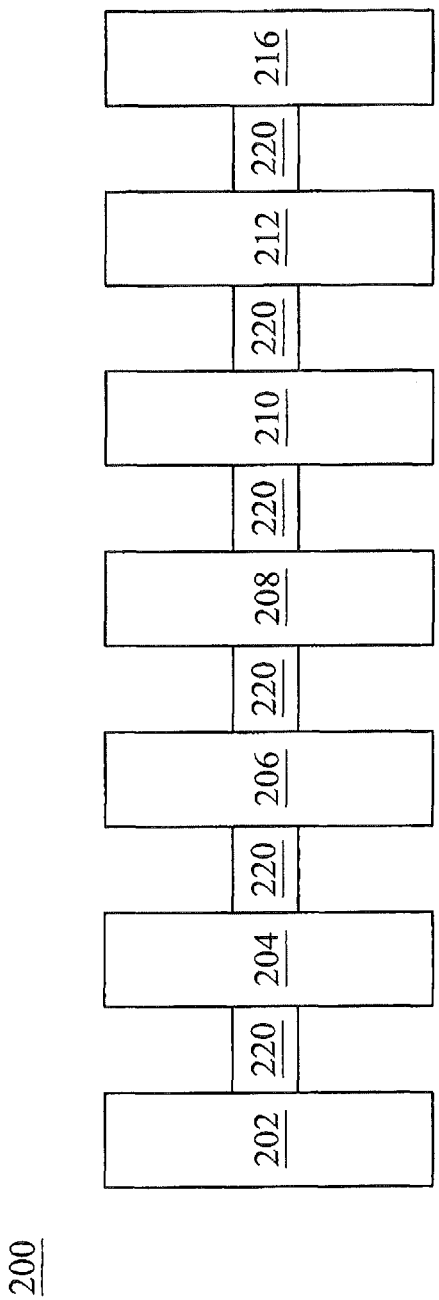
FIG. 2A is a block diagram of an integrated semiconductor die parceling platform, in accordance with some embodiments.

FIG. 2A is a block diagram of an integrated semiconductor die parceling platform 200, in accordance with some embodiments. The integrated semiconductor die parceling platform 200 may include multiple stations 202-216 that are connected via a conveyor system 220. The conveyor system 220 may describe the automated interconnections between the stations 202-216 to bring the die vessels to and/or from the stations 202-216. In certain embodiments, the conveyor system may convey die vessels via conveyor belts and robotic arms configured to receive the die vessels at one station and to move the die vessels for receipt (e.g., processing) at another station. The conveyor belt may represent any physical apparatus configured for substantially lateral motion, such as a conveyor belt with rollers and pulleys that may transport die vessels across a top surface of the conveyor belt. For example, the conveyor system 220 may connect, in order, a load port station 202, a buffer station 204, an inspection station 206, a desiccant station 208, a bundle station 210, a bagging station 212, and a folding station 216. Each station may be a stationary point or location for processing a semiconductor die vessel in the course of being processed by the integrated semiconductor die parceling platform, from the initial load port station 202 to the final folding station 216.

Accordingly, the integrated semiconductor die parceling platform may provide an integrated platform where each station is connected with another in an automated fashion. A die vessel need only be brought to a load port station of the integrated semiconductor die parceling platform to be processed. Then, the die vessels may be inspected, bundled, bagged, labeled, and then placed in an out port car for transport from the integrated semiconductor die parceling platform, all without manual or human intervention by an operator of the integrated semiconductor die parceling platform.

Figure 2B:
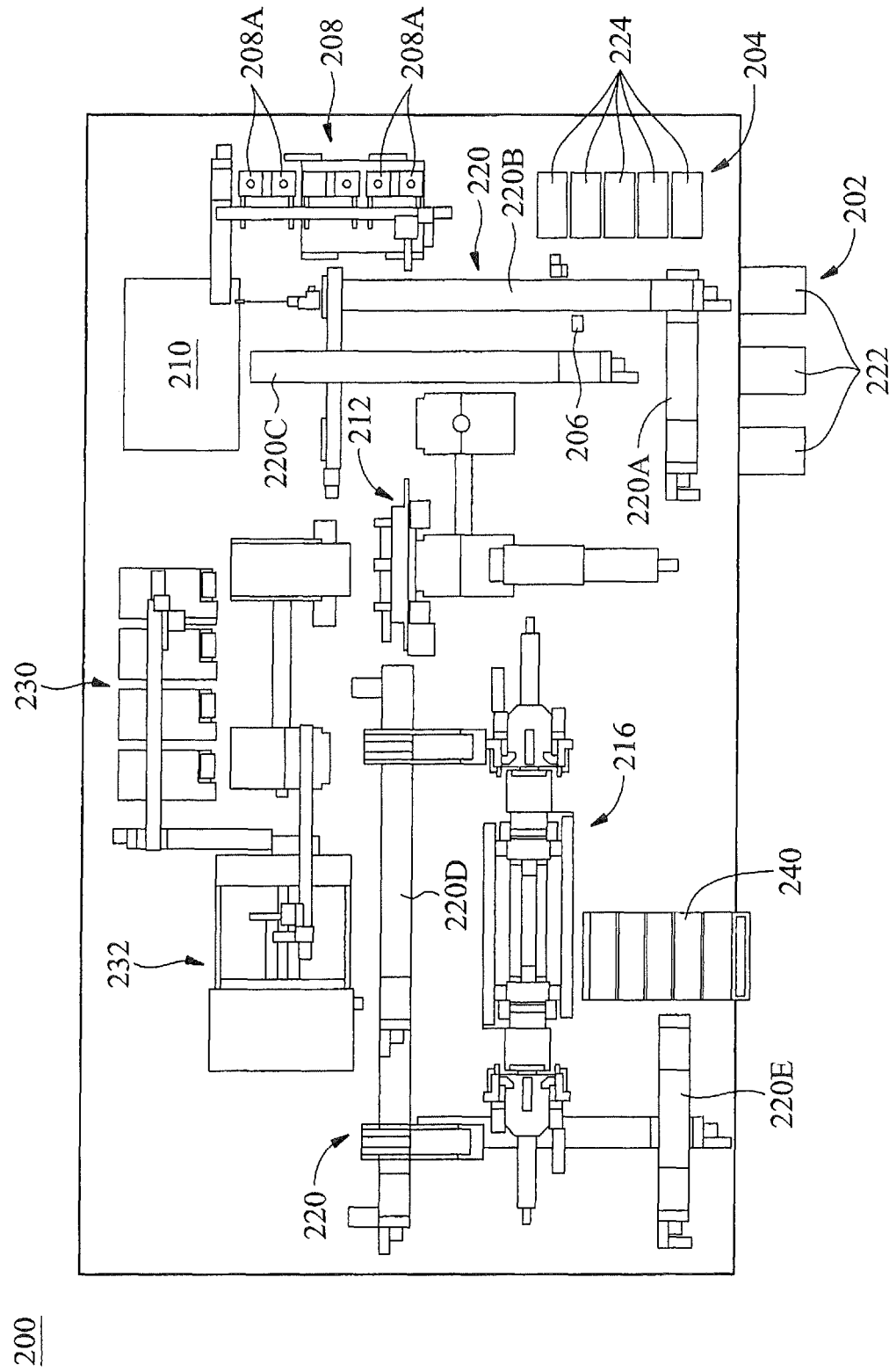
FIG. 2B is a plan view illustration of the integrated semiconductor die parceling platform, in accordance with some embodiments.

FIG. 2B is a plan view illustration of the integrated semiconductor die parceling platform 200, in accordance with some embodiments. As noted above, the integrated semiconductor die parceling platform may have the load port station 202, the buffer station 204, the inspection station 206, the desiccant station 208, the bundle station 210, the bagging station 212, the labeling station 214 and the folding station 216.

The conveyor system 220 may be configured to move die packages between the load port station 202, the buffer station 204, the inspection station 206, the desiccant station 208, the bundle station 210, the bagging station 212, the labeling station 214 and the folding station 216. The conveyor system may include conveyor belts configured to move die containers (e.g., die vessels, die bundles, and/or die bags) in a substantially lateral motion to and from stations. To facilitate the movement via the conveyor belts, robotic alms (not illustrated) may be located next to the conveyor belts to move die containers to and from the conveyor belt and a nearby station.

The load port station 202 may include one or more load port shelves 222, such as three load port shelves 222 in the illustrated embodiment. Also, the buffer station 204 may have multiple buffer shelves 224, such as five buffer shelves 224. The conveyor system may include a first conveyor belt 220A to bring the die vessels from the load port station 202 to the buffer station 204. The conveyor system may also include one or more robotic arms, in addition to the first conveyor belt 220A, to move the die vessels to and from the first conveyor belt 220A and the load port station 202 and/or the buffer station 204.

The inspection station 206 may include a sensor arranged over a part of a second conveyor belt 220B of the conveyor system 220. The second conveyor belt 220B may move die vessels from the buffer station 204, to the desiccant station 208, and then to the bundle station 210. The inspection station is illustrated to a side of the second conveyor belt 220B for ease of illustration, but may be disposed above the second conveyor belt 220B in certain embodiments. The conveyor system 220 may include the second conveyor belt 220B and one or more robotic arms (not illustrated) to move die vessels to and from the second conveyor belt 220B.

The desiccant station 208 may include multiple desiccant loaders 208A, which may place a desiccant on a die vessel, such as a die vessel being transported by the conveyor belt 220A. In certain embodiments, the second conveyor belt 220B may be configured to move die vessels into the bundle station 210 to form die bundles. For ease of illustration in this plan view, the first conveyor belt 220A is illustrated as separated from the bundle station 210 but may be connected to the bundle station 210 in certain embodiments so that die vessels may enter the bundle station 210. In other embodiments, the second conveyor belt 220B may not enter the bundle station 210 so that a robotic arm may move die vessels from the second conveyor belt 220B to the bundle station 210.

Die bundles may be transported from the bundle station via a third conveyor belt 220C of the conveyor system 220. This third conveyor belt 220C may move the die bundles from the bundle station 210 to the bagging station 212. In certain embodiments, at least one robotic arm may move die bundles between the bundle station 210 and the third conveyor belt 220C and/or between the third conveyor belt 220C and the bagging station 212.

The bagging station 212 may bag the die bundles to produce a die bag from each die bundle. As noted above, the bagging station may also bag the die bundles so that the die bundles are in a vacuum environment that is heat sealed. In certain embodiments, the bagging station 212 may also label the bags either before, during, or after the bags receive their respective die bundles. In various embodiments, the bagging station may store bags at a bag storage area 232, then label the bags using a barcode printer 230 before depositing die bundles within bags to form die bags.

The die bags may exit the bagging station 212 and be transported to the folding station 216 via a fourth conveyor belt 220D of the conveyor system 220. In certain embodiments, at least one robotic arm may move die bundles between the bagging station 212 and the fourth conveyor belt 220D and/or between the fourth conveyor belt 220D and the folding station 216.

The folding station may fold the die bag in a manner that may be inserted within an out port car. In certain embodiments, the folding station may interface with a fifth conveyor belt 220E that may take a folded die bag and place the folded die bag within an out port car 240. Thus, the conveyor system may include one or more robotic arms, in addition to the fifth conveyor belt 220E, to move die vessels to and from the fifth conveyor belt 220E. In other embodiments, the folding station may directly place the folded die bag into the out port car 240, such as via a robotic arm of the folding station.

Figure 2C:
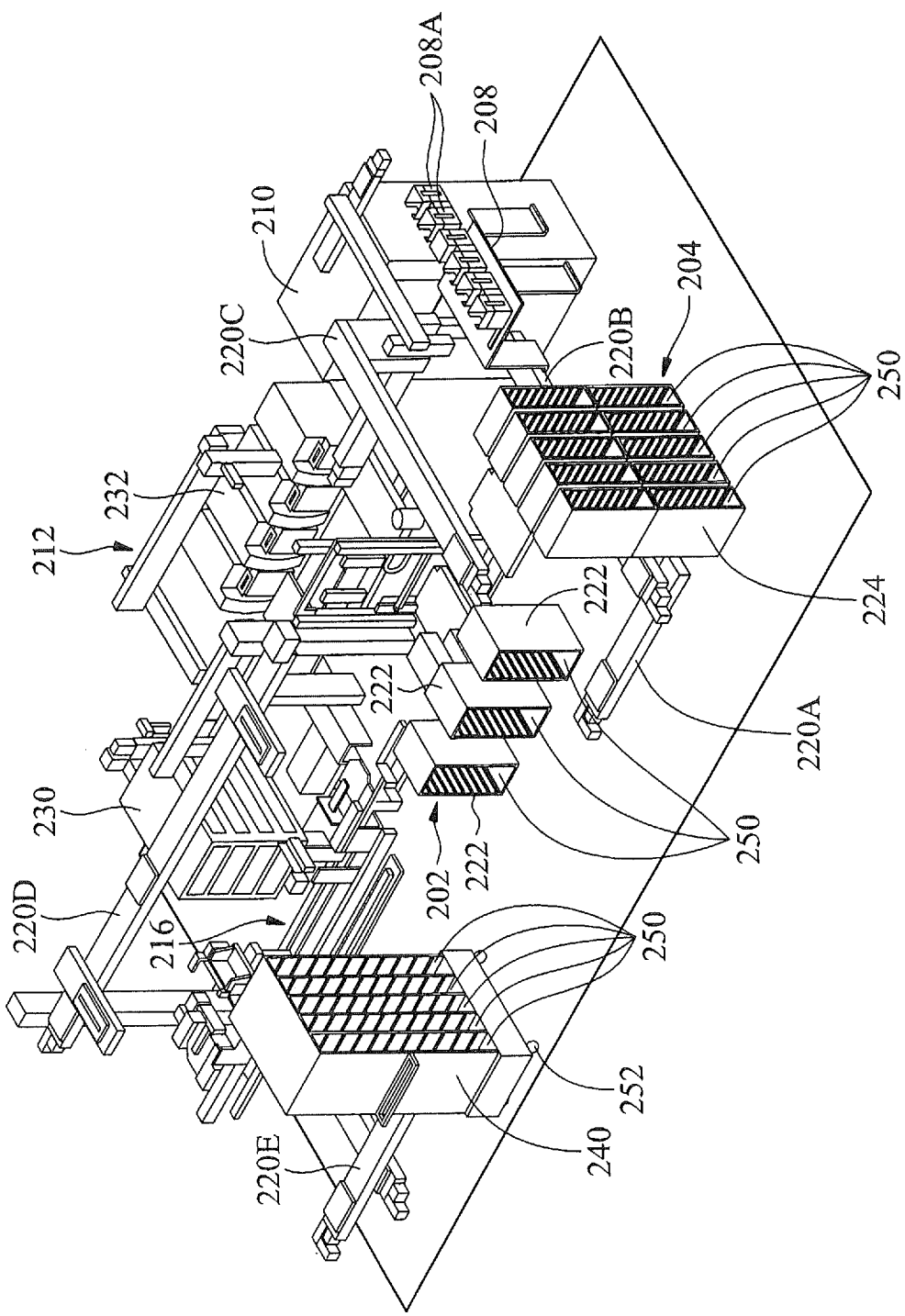
FIG. 2C is a perspective view illustration of the integrated semiconductor die parceling platform, in accordance with some embodiments.

FIG. 2C is a perspective view illustration of the integrated semiconductor die parceling platform 200, in accordance with some embodiments. As noted above, the integrated semiconductor die parceling platform may have the load port station 202, the buffer station 204, the inspection station 206, the desiccant station 208, the bundle station 210, the bagging station 212, and the folding station 216.

The load port station 202, the buffer station 204, and the out port car 240 may include shelves 250 from which die containers (e.g., a die vessel or a die bag) may be secured and/or guided along during insertion or removal from a respective load port station 202, buffer station 204, or out port car 240. When inserted, the die vessels may be located at a set predetermined vertical distance from each other, as determined by the shelves 250. In addition to having shelves to store die bags, the out port car 240 may include wheels 252 in which the out port car 240 may be wheeled away from the semiconductor die parceling platform 200.

Figure 3:
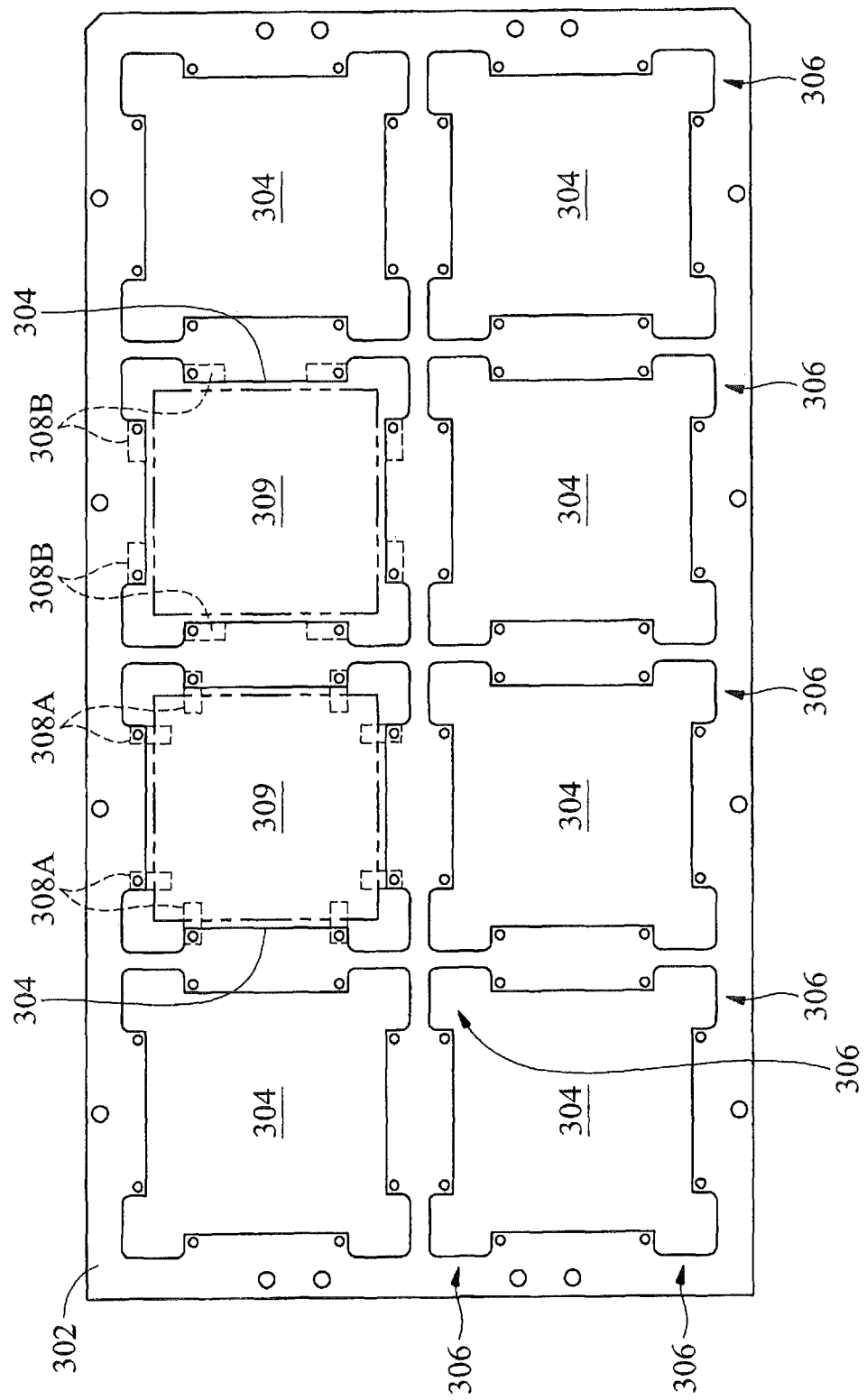
FIG. 3 is a schematic diagram of a die vessel, in accordance with some embodiments.

FIG. 3 is a schematic diagram of a die vessel 302, in accordance with some embodiments. The die vessel 302 may include a number of receptacles 304 in which to a die may be placed. For example, there may be eight receptacles 304, as illustrated in the embodiment of FIG. 3A. Each of the receptacles may be substantially rectangular in shape with a further protrusion along the square corner portions 306 of a respective receptacle 304. Optionally, each of the square corner portions 306 may be adjacent to pin holes in which a pin 308A, 308B may be disposed. The pins 308A, 308B may be configured (e.g., rotated) to be disposed over a die when the die is to be transported using the die vessel 302 and to be removed from over the die when the die is not to be transported using the die vessel. For example, pins 308A (drawn in phantom) illustrate how the pins 308A is disposed over a die 309 (drawn in phantom) when the die is to be transported using the die vessel 302. Also, pins 308B (drawn in phantom) illustrate how the pins 308B are not disposed over a die 309 when the die 309 is not to be transported using the die vessel 302 (e.g., to be removed from the die vessel).

Figure 4A:
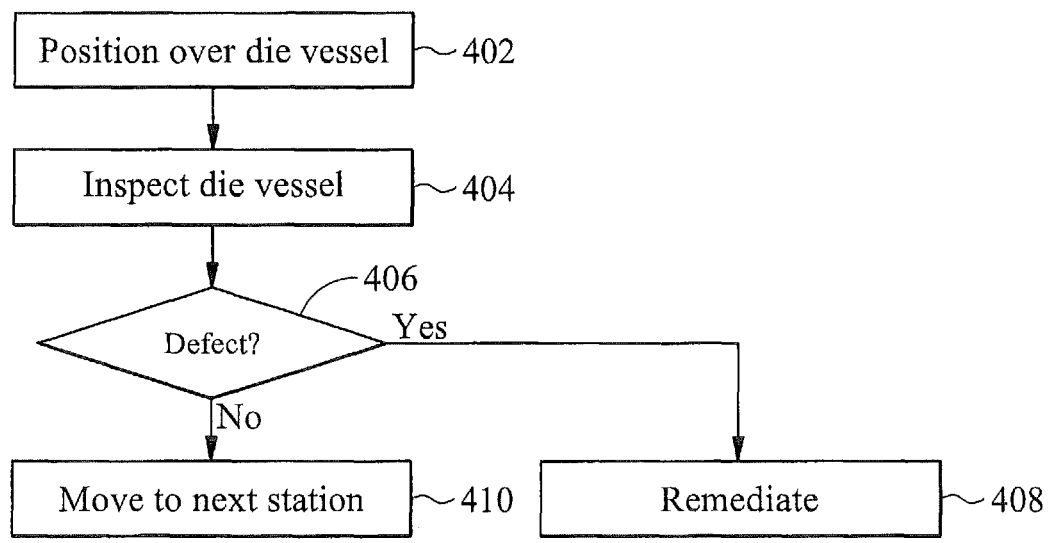
FIG. 4A is a flowchart of an inspection process, in accordance with some embodiments.

FIG. 4A is a flowchart of an inspection process 400, in accordance with some embodiments. The inspection process 400 may be performed by an integrated semiconductor die parceling platform. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, the inspection station of the integrated semiconductor die parceling platform may position an image sensor over a die vessel. In certain embodiments, the image sensor may be positioned by remaining stationary while a die vessel is brought within the image sensor's field of view. Accordingly, the conveyor system of the integrated semiconductor die parceling platform may move the die vessel within the image sensor's field of view in order for the image sensor to be positioned over the die vessel.

At operation 404, the inspection station may be configured to inspect the die vessels for defects. This inspection may include collecting image data using the image sensor and analyzing the image data for defects. In various embodiments, the inspection station may include an image sensor configured to capture image data of semiconductor dies on a die vessel at known (e.g., predetermined or expected) locations on the die vessel. This image data may be analyzed to determine whether there is a defect. These defects may be defects of the die vessel itself and/or the constituent semiconductor dies. For example, the inspection station may be configured to inspect the die vessel for a defects, such as lack of an expected number of semiconductor dies on the die vessel. The inspection station may also be configured to inspect the semiconductor dies on the die vessels, such as to detect whether the semiconductor dies are of a correct size and/or if they have an unexpected surface feature or non-uniformity.

At operation 406, a decision may be made as to whether there is a defect based on the inspection at operation 404. If there is a defect, the process 400 may proceed to operation 408. If no defect is detected, the process may proceed to operation 410.

At operation 408, a remediation step may be performed to remediate for the defect. This remediation step may include, for example, removing the die vessel with the defect from the integrated semiconductor die parceling platform. In other embodiments, this remediation may include moving the defective die vessel associated with the defect (e.g., defect at the die vessel or at an individual semiconductor die) to a remediation location for remediation and/or not further processing the defective die vessel.

At operation 410, the conveyor system may move the die vessel from the inspection station to another station should no defect be detected. For example, the conveyor system may move the die vessel to a desiccant station should no defect be detected.

Figure 4B:
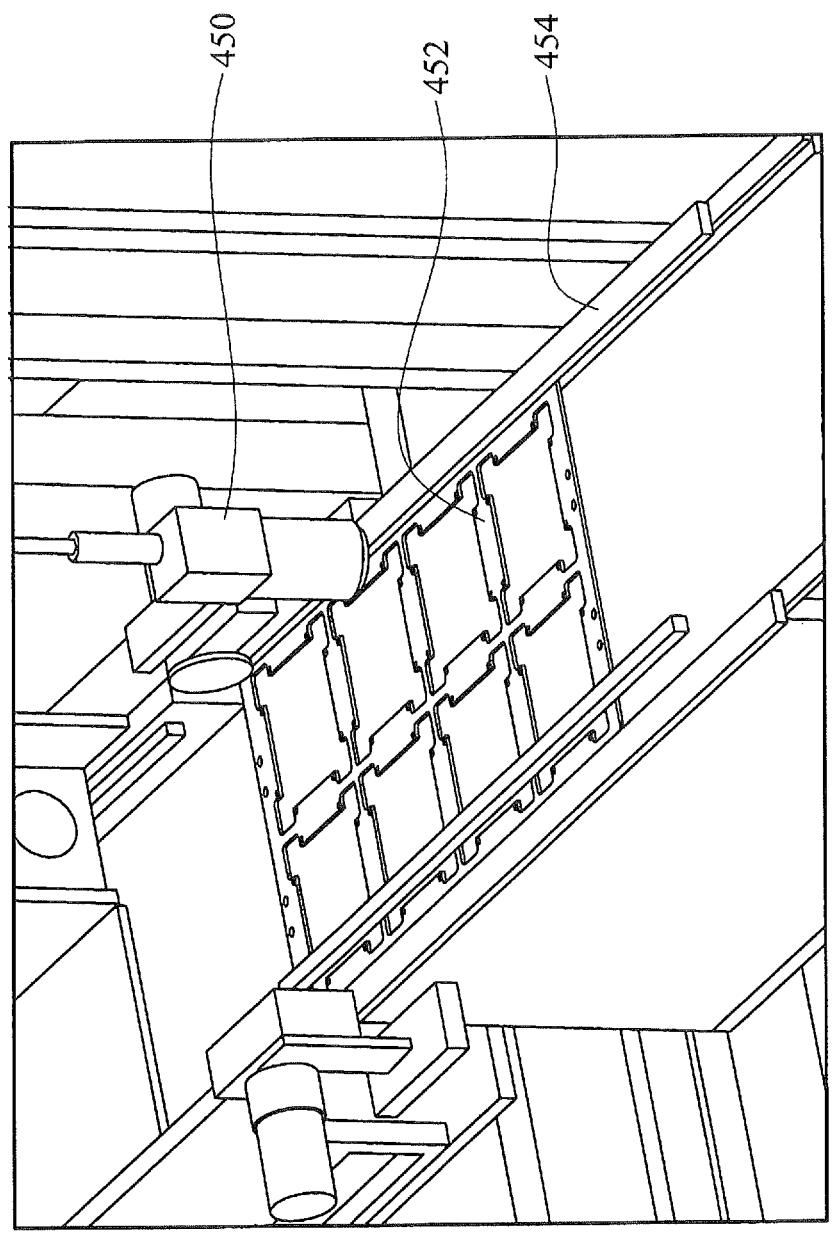
FIG. 4B illustrates an image sensor of an inspection station positioned over a die vessel, in accordance with some embodiments.

FIG. 4B illustrates an image sensor 450 of an inspection station positioned over a die vessel 452, in accordance with some embodiments. The image sensor 450 may remain stationary while the die vessel 452 is brought within the image sensor's field of view while moving along a conveyor belt 454 (e.g., the second conveyor belt, discussed above) of an integrated semiconductor die parceling platform's conveyor system. Accordingly, the conveyor system of the integrated semiconductor die parceling platform may move the die vessel 452 within the image sensor's field of view in order for the image sensor 450 to be positioned over the die vessel to collect image data of the die vessel 452.

Figure 5:
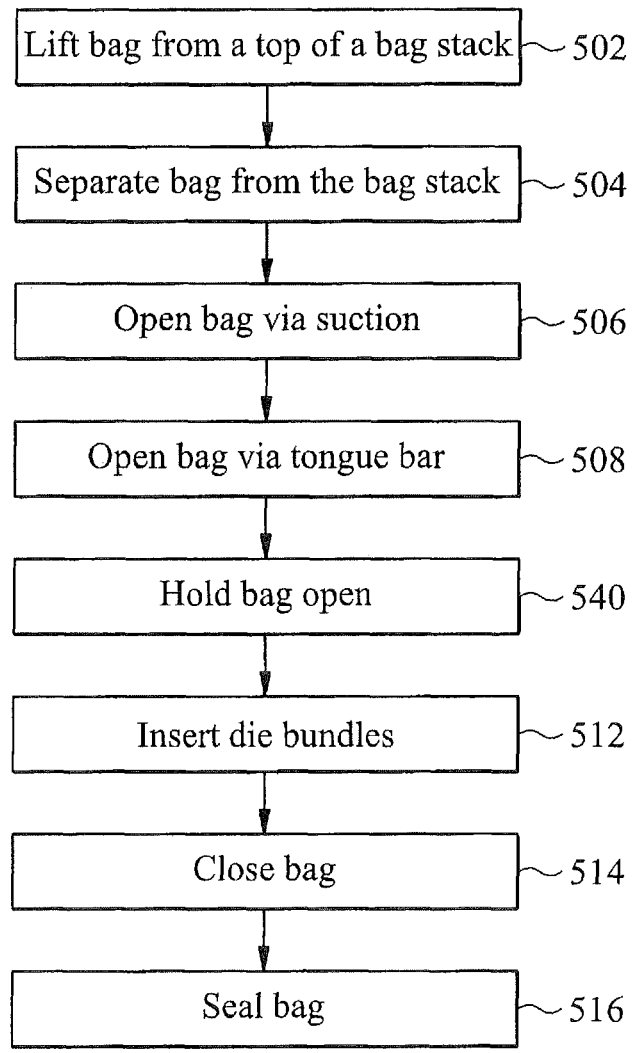
FIG. 5 is a flowchart of an inspection process, in accordance with some embodiments.

FIG. 5 is a flowchart of an inspection process, in accordance with some embodiments. The inspection process may be performed by a integrated semiconductor die parceling platform. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

In some embodiments, the operations or blocks of the process 500 may be associated with various illustrated features as shown in FIGS. 6A, 6B, 6C, 6D, 6E, 6F, 6G, 6H, 6I, and 6J respectively, which will be discussed in further detail below. Referring now to FIG. 5, the process 500 starts with operation 502, where a bag may be lifted from a top of a bag stack. The process 500 continues to operation 504, where the bag may be separated from the bag stack. The process 500 continues to operation 506, where the bag may be opened via suction forces. The process continues to operation 508, where the bag may be opened via a tongue bar. The process 500 continues to operation 510, where the bag may be fully opened. The process 500 continues to operation 512, where die bundles may be inserted in the bag. The process 500 continues to operation 514, where the bag may be closed. The process 500 continues to operation 516, where the bag may be heat sealed.

Figure 6A:
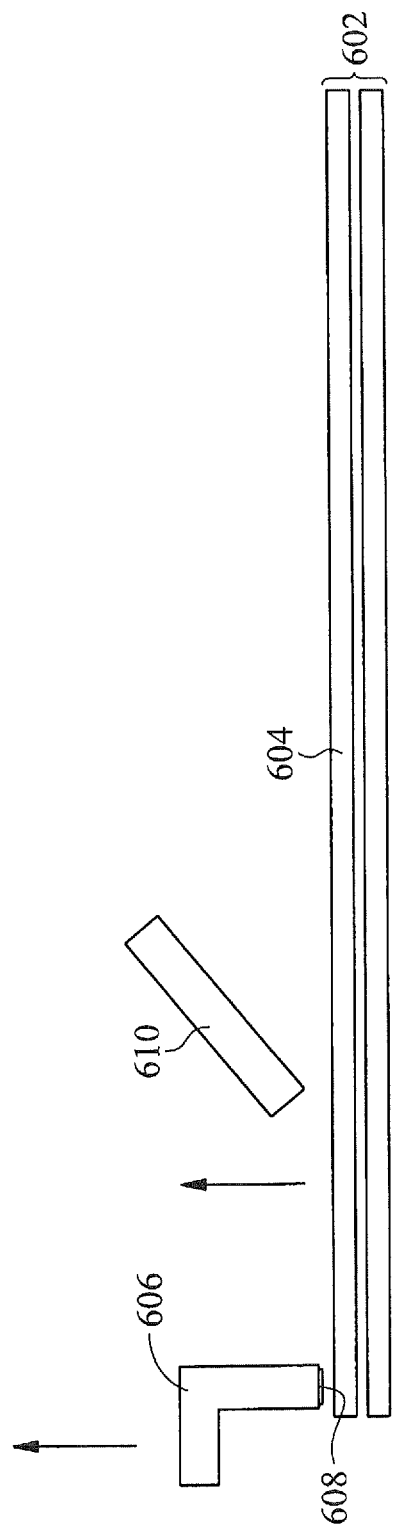
FIG. 6A is a side view illustration of how a bag may be lifted from a top of a bag stack, in accordance with some embodiments.

FIG. 6A is a side view illustration of how a bag may be lifted from a top of a bag stack, corresponding to operation 502 of FIG. 5, in accordance with some embodiments. The bag stack 602 may include multiple bags stacked one on top of another. A bag 604 on the top of the bag stack 602 may undergo a suction force via suction tubes 606. More specifically, respective suction openings 608 of the suction tubes 606 may touch a portion of the bag proximate with a bag opening. A guide bar may be disposed above the bag to control the portion of the bag 604 lifted by the suction produced by the suction openings 608. The bag may be lifted via moving the suction tubes in an upward motion away from the bag stack 602. In certain embodiments, the suction force at each of the suction tubes may be around 30 pounds per square inch (PSI).

Figure 6B:
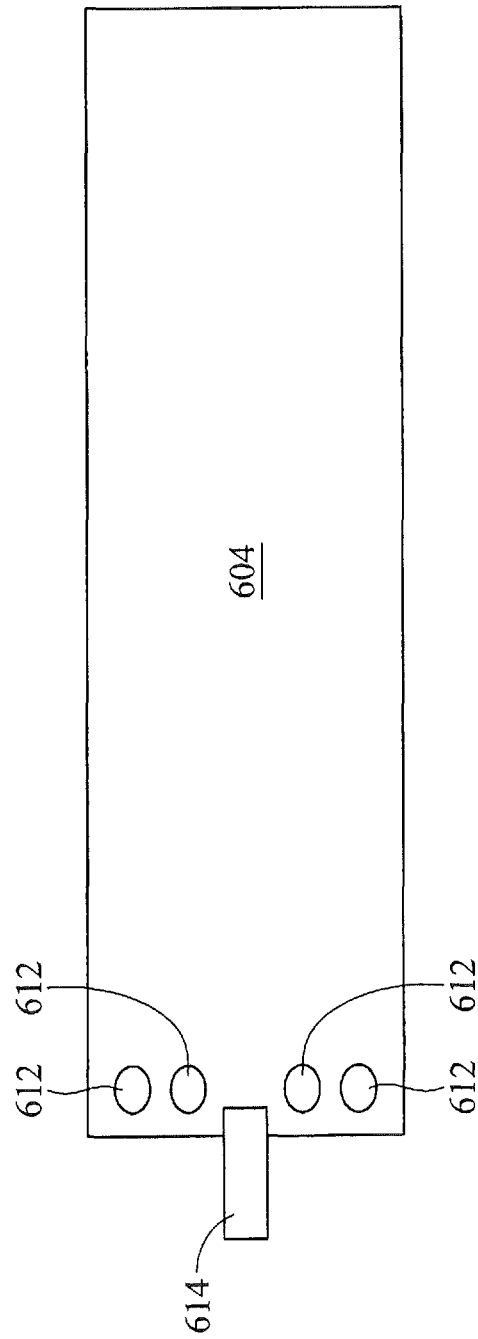
FIG. 6B is a side view illustration of how the bag may be lifted from the top of the bag stack, in accordance with some embodiments.

FIG. 6B is a side view illustration of how the bag 604 may be lifted from the top of the bag stack, corresponding to operation 502 of FIG. 5, in accordance with some embodiments. The plan view includes multiple suction locations 612 for the suction openings to contact the bag 604. In certain embodiments, a clamp 614 may secure an end of the bag 604 and moved to assist the lifting of the bag by the suction openings 608.

Figure 6C:
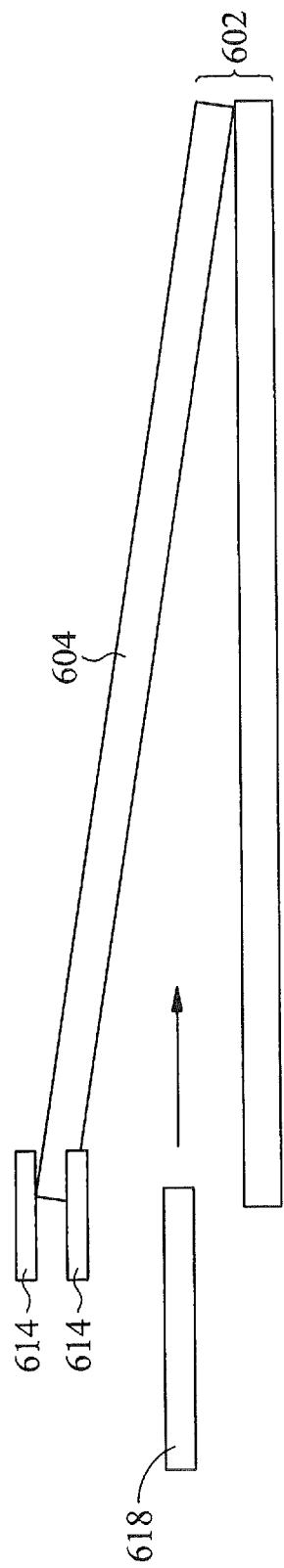
FIG. 6C is a side view illustration of how the bag may be separated from the bag stack, in accordance with some embodiments.

FIG. 6C is a side view illustration of how the bag 604 may be separated from the bag stack 602, corresponding to operation 504 of FIG. 5, in accordance with some embodiments. As noted above, the clamp 614 may secure an end of the bag 604. The clamp 614 may secure the bag 604 by a pincer motion that pinches a top surface and a lower surface of the bag 604. Also, as the clamp 614 lifts the bag in an upward motion, a tongue bar 618 may be slipped under the bag 604 to separate the bag 604 from other bags in the bag stack 602. In certain embodiments, the tongue bar may be about 10 millimeters in thickness to present a sufficiently slim profile for bag separation.

Figure 6D:
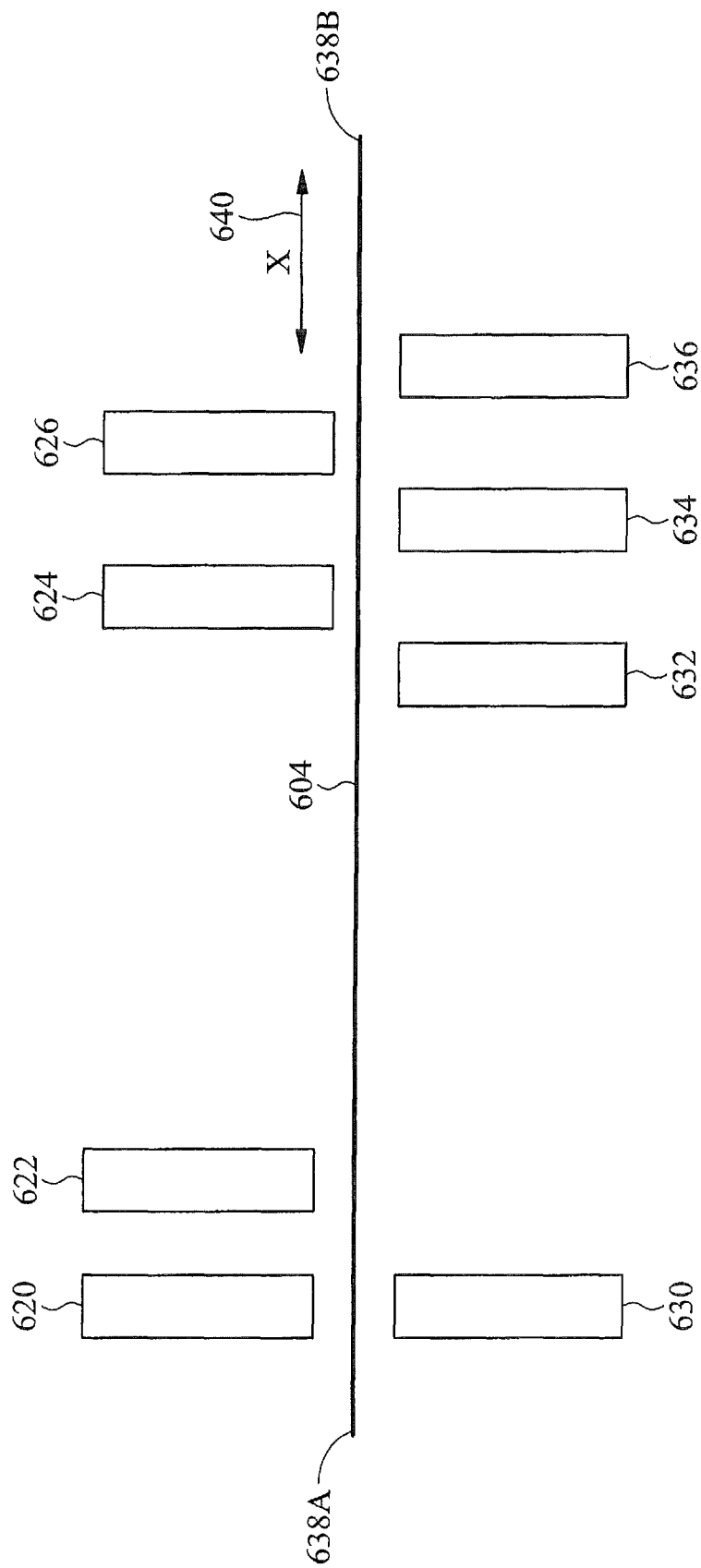
FIG. 6D is a side view illustration of how the bag may be opened, in accordance with some embodiments.

FIG. 6D is a side view illustration of how the bag 604 may be opened, corresponding to operation 506 of FIG. 5, in accordance with some embodiments. Top suction tubes may be arranged around four top suction tube positions 620, 622, 624, 626 so as to contact the bag 604 from a top side. Also, bottom suction tubes may be arranged also around four bottom suction tube positions 630, 632, 634, 636 so as to contact the bag 604 from a bottom side. Each of the suction tube positions 620, 622, 624, 626, 630, 632, 634, 636 may also represent a respective suction opening position that faces the bag. Two of the top suction tube positions 620, 622 may be closer to a first opening end 638A of the bag 604. Another two of the top suction tube positions 624, 626 may be closer to a second end 638B of the bag opposite the first opening end of the bag 604. Likewise, the bottom suction tube position 630 may be closer to the first opening end of the bag 604 than the other three suction tube positions 632, 634, 636. Also, the suction tube positions 620 and 630 may be aligned along a first horizontal axis 640A (e.g., an X axis). The top suction tube positions 624 626 may be offset along the first horizontal axis 640A from the bottom suction tube positions 632, 634, and 636.

Figure 6E:
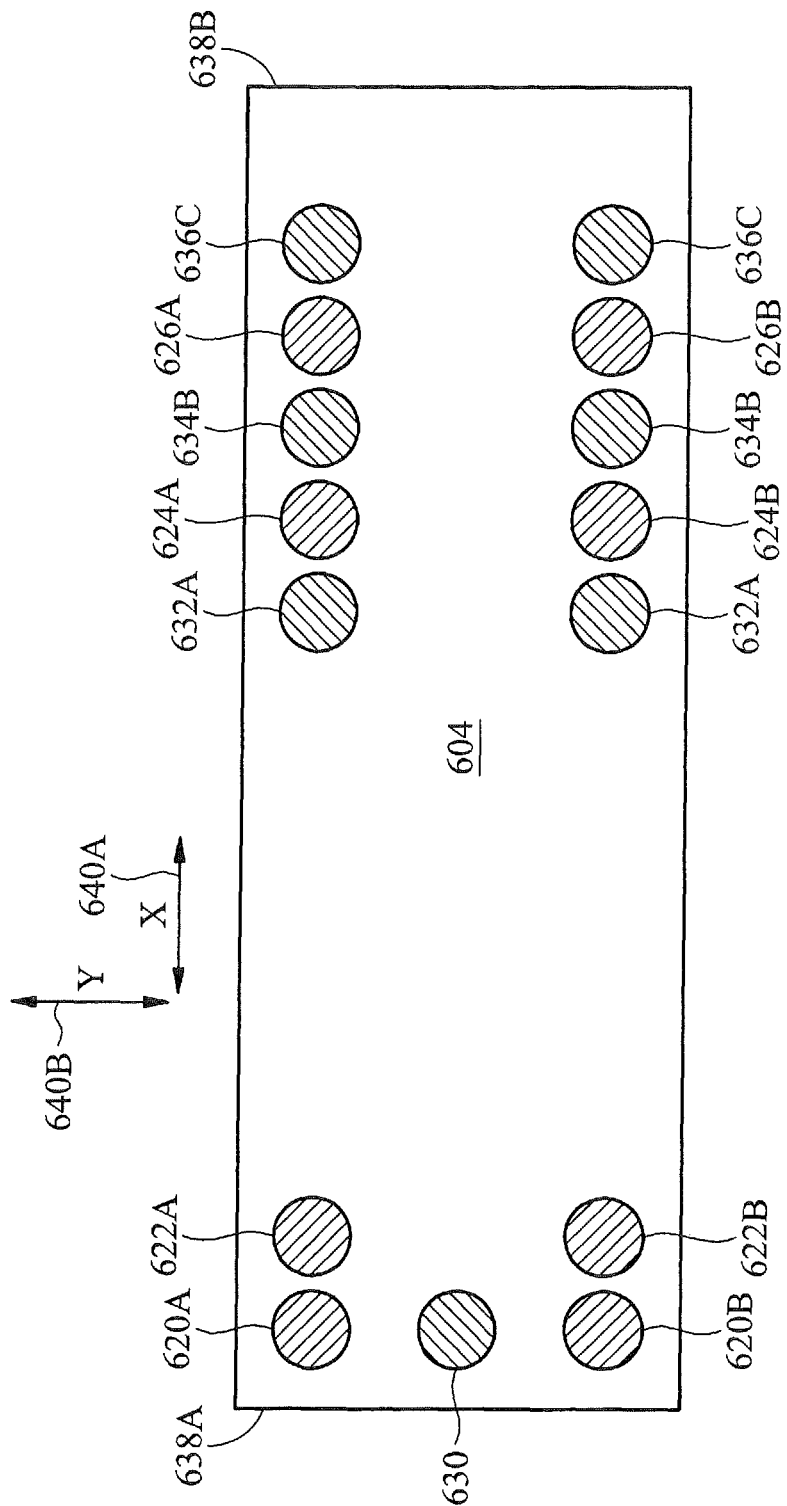
FIG. 6E is a plan view illustration of the suction tube positions relative to the bag, in accordance with some embodiments.

FIG. 6E is a plan view illustration of the suction tube positions relative to the bag 604, corresponding to operation 506 of FIG. 5, in accordance with some embodiments. The top suction tube positions 620A and 620B may correspond to the suction tube position 620 along the first horizontal axis 640A. However, the top suction tube positions 620A and 620B may be displaced from each other closer to opposite ends of the bag 604 along a second horizontal axis 640B. Also, the top suction tube positions 622A and 622B may correspond to the suction tube position 622 along the first horizontal axis 640A. However, the suction tube positions 622A and 622B may be displaced from each other closer to opposite ends of the bag 604 along the second horizontal axis 640B. Also, the top suction tube positions 624A and 624B may correspond to the suction tube position 624 along the first horizontal axis 640A. However, the suction tube positions 624A and 624B may be displaced from each other closer to opposite ends of the bag 604 along the second horizontal axis 640B. Also, the top suction tube positions 626A and 626B may correspond to the suction tube position 624 along the first horizontal axis 640A. However, the suction tube positions 626A and 626B may be displaced from each other closer to opposite ends of the bag 604 along the second horizontal axis 640B.

Similarly, the bottom suction tube position 632A and 632B may correspond to the suction tube position 632 along the first horizontal axis 640A. However, the suction tube positions 632A and 632B may be displaced from each other closer to opposite ends of the bag 604 along the second horizontal axis 640B. Also, the bottom suction tube position 634A and 634B may correspond to the suction tube position 634 along the first horizontal axis 640A. However, the suction tube positions 634A and 634B may be displaced from each other closer to opposite ends of the bag 604 along the second horizontal axis 640B. Also, the bottom suction tube position 636A and 636B may correspond to the suction tube position 636 along the first horizontal axis 640A. However, the suction tube positions 636A and 636B may be displaced from each other closer to opposite ends of the bag 604 along the second horizontal axis 640B. Lastly, the bottom suction tube position 630 may be equidistant from the top suction tube positions 620A and 620B along the second horizontal axis 640B. In certain embodiments, the suction force at each of the suction tubes may be around 30 pounds per square inch (PSI).

Figure 6F:
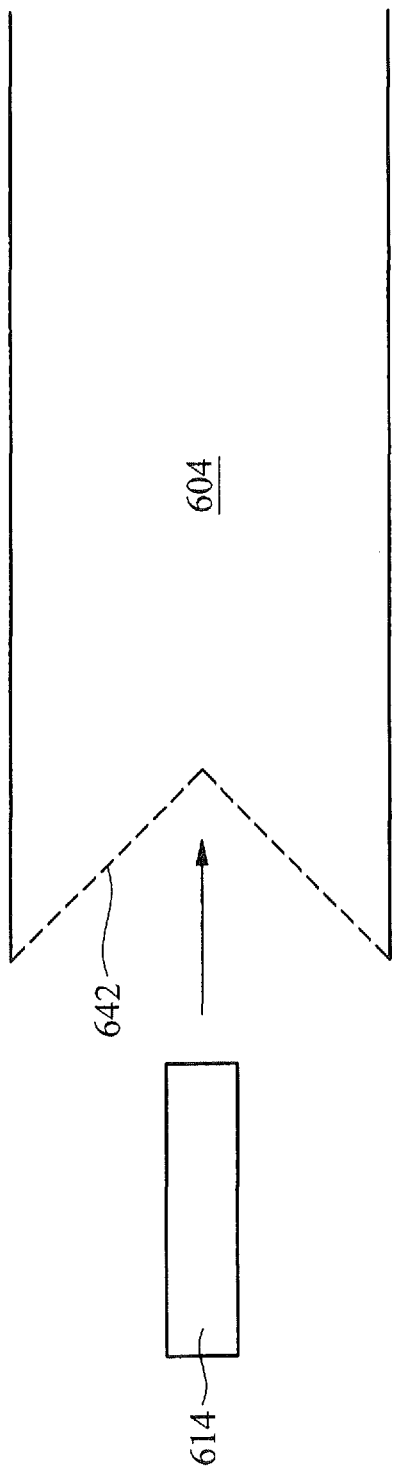
FIG. 6F is a side view illustration of how the bag may be opened using the tongue bar, in accordance with some embodiments.

FIG. 6F is a side view illustration of how the bag 604 may be opened using the tongue bar 618, corresponding to operation 508 of FIG. 5, in accordance with some embodiments. As the bag 604 is opened (e.g., as the opening 642 is revealed as the bag is opened), the tongue bar 618 may be inserted into the opening to further open the bag 604.

Figure 6G:
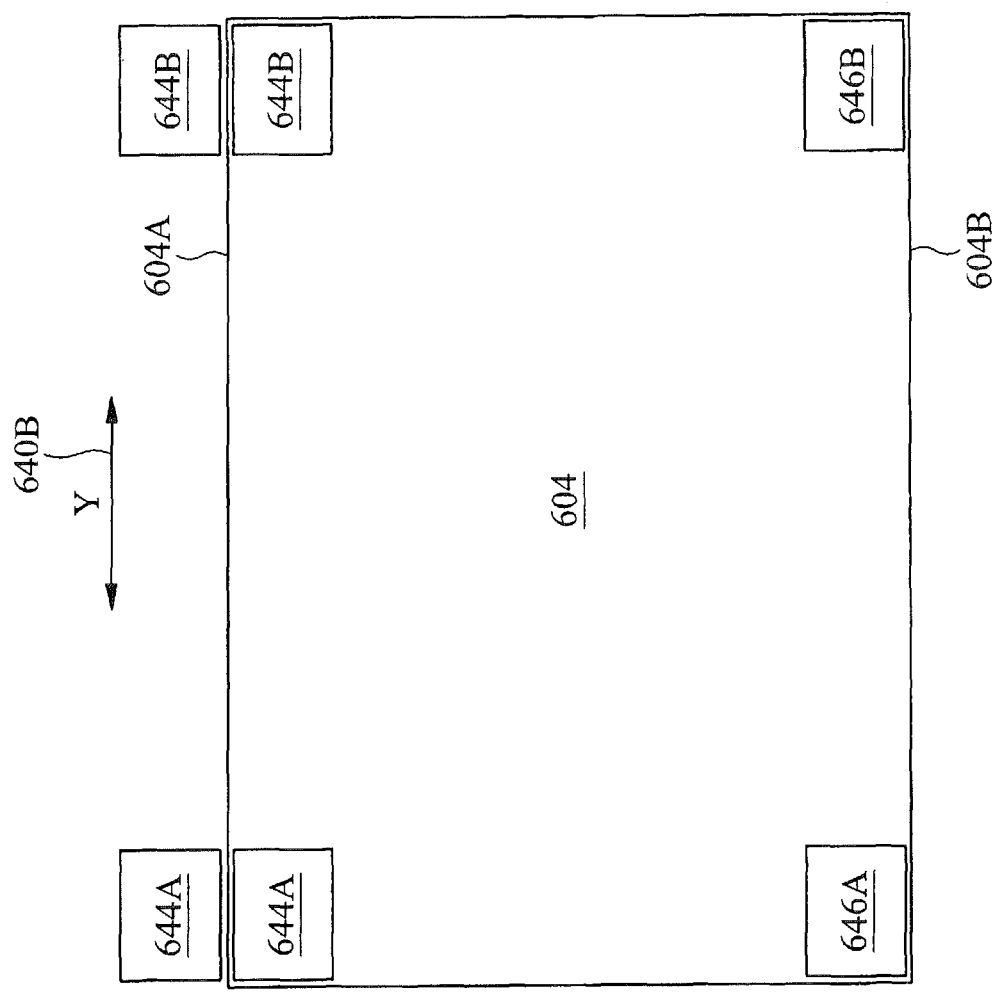
FIG. 6G is a front view illustration of how the bag may be fully opened, in accordance with some embodiments.

FIG. 6G is a front view illustration of how the bag 604 may be fully opened, corresponding to operation 510 of FIG. 5, in accordance with some embodiments. The horizontal aspect of the front view may be along the second horizontal axis 640B. Opening clamps 644A, 644B may grasp onto a top portion 604A of the bag 604 and opening bars 646A, 646B may be against a bottom portion 604B of the bag 604. More specifically, the bag 604 may be fully opened when the opening clamps 644A, 644B, while grasping onto the top portion 604A of the bag 604 is at a maximum distance away from the opening bars 646A, 646B against the bottom portion 604B of the bag 604.

Figure 6H:
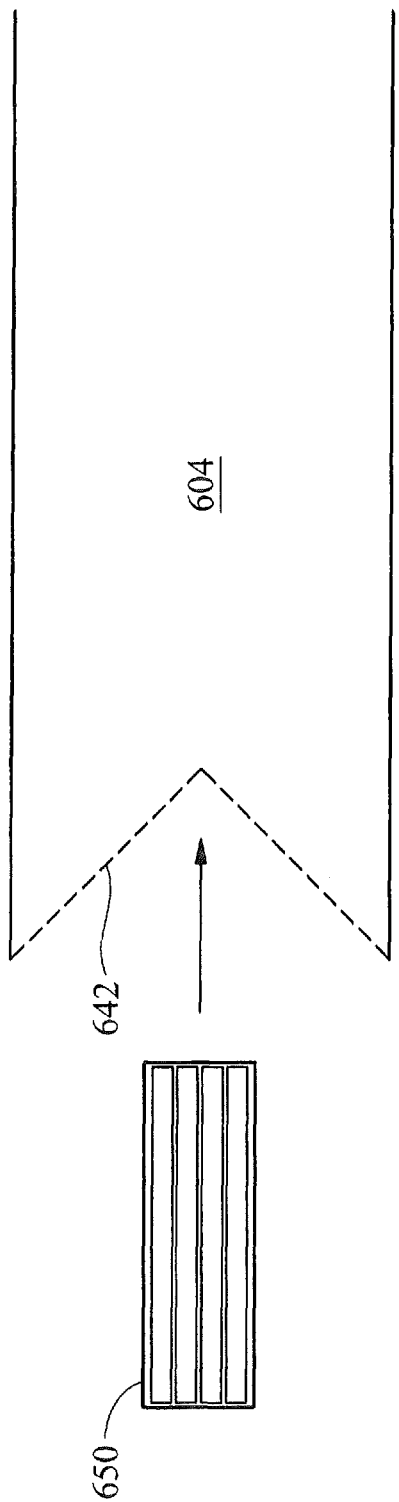
FIG. 6H is a side view illustration of how the die bundles may be inserted in the bag, in accordance with some embodiments.

FIG. 6H is a side view illustration of how the die bundles 650 may be inserted in the bag 604, corresponding to operation 512 of FIG. 5, in accordance with some embodiments. As noted above, the die bundle 650 may be a collection of die vessels stacked on each other and bundled together with a harness. The die bundle may be inserted into the bag 604 via the opening 642 of the bag.

Figure 6I:
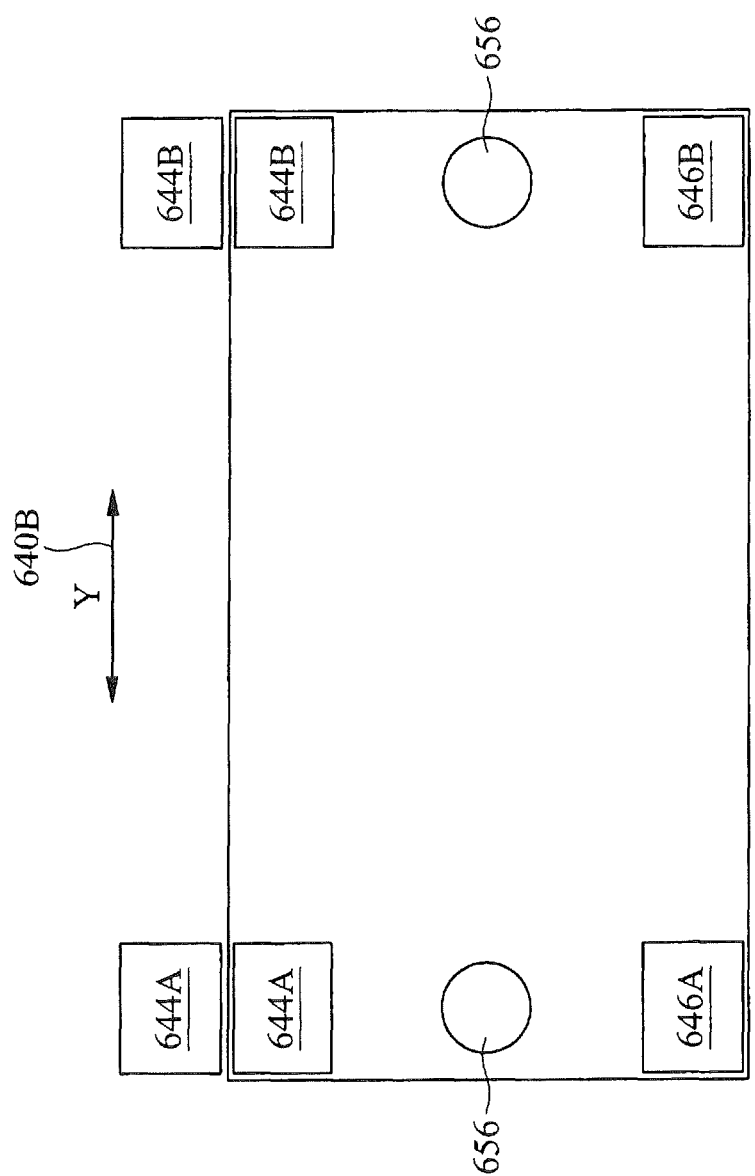
FIG. 6I is a front view illustration of how the bag may be closed, in accordance with some embodiments.

FIG. 6I is a front view illustration of how the bag 604 may be closed, corresponding to operation 514 of FIG. 5, in accordance with some embodiments. As noted above, opening clamps 644A, 644B may grasp onto a top portion 604A of the bag 604 and the opening bars 646A, 646B may be against a bottom portion 604B of the bag 604. The bag 604 may be closed by moving the opening clamps 644A, 644B, while grasping onto the top portion 604A of the bag 604, toward the opening bars 646A, 646B against the bottom portion 604B of the bag 604. Also, suction conduits 656 may be configured to suction the gas out of the bag 604 while the opening clamps 644A, 644B are moved toward the opening bars 646A, 646B. The suction conduits may be located toward a side of the bag 604 between the opening clamps 644A, 644B and the opening bar 646A, 646B.

Figure 6J:
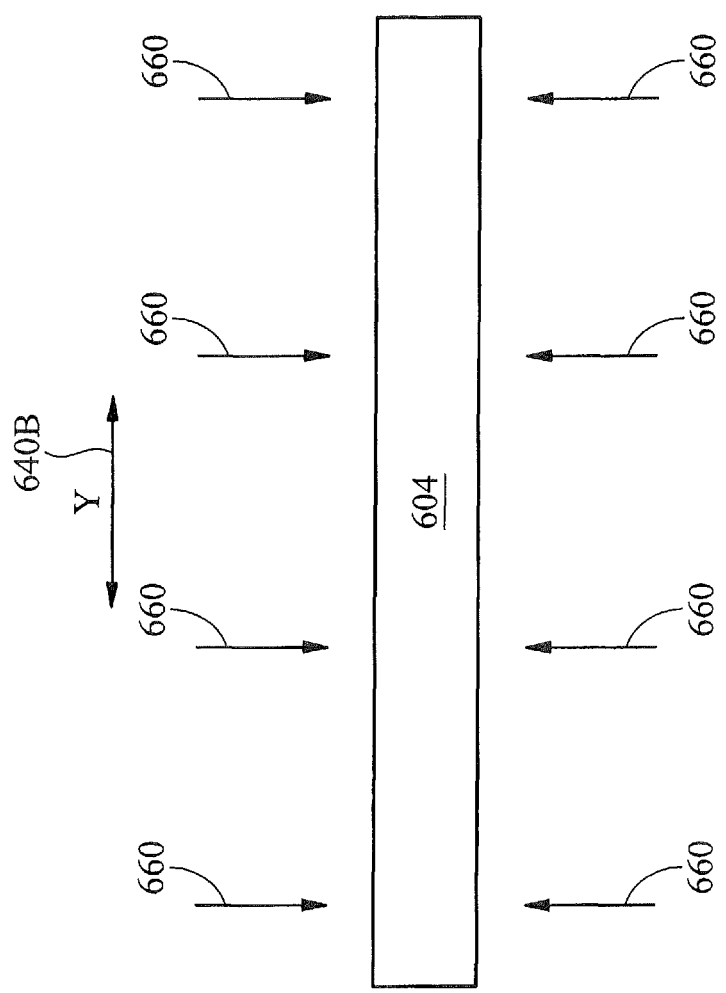
FIG. 6J is a front view illustration of how the bag may be sealed, in accordance with some embodiments.

FIG. 6J is a front view illustration of how the bag 604 may be sealed, corresponding to operation 516 of FIG. 5, in accordance with some embodiments. The closed bag, with the clamps 614 and tongue bar 618 removed, may be heat sealed by applying heat 660 from one end of the bag to the other end of the bag along the second horizontal axis 640B from both a top and bottom of the bag 604. In certain embodiments, the bag may be made of a metal, such as aluminum, which may melt and seal the bag. In particular embodiments, an impulse sealer may be utilized to perform heat sealing of the bag 604. In certain embodiments, the heat applied may heat the bag from about 80 to about 250 degrees centigrade and the width of the seal may be greater than 10 millimeters.

Figure 7:
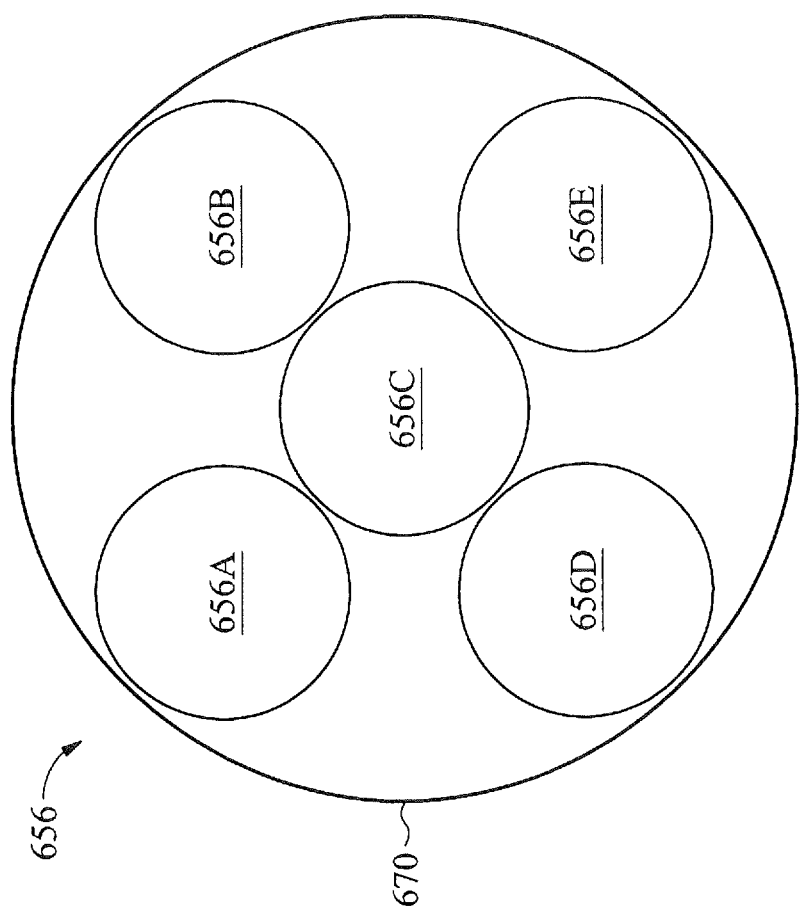
FIG. 7 is a cross sectional illustration of a suction conduit made of multiple individual constituent tubes, in accordance with some embodiments.

FIG. 7 is a cross sectional illustration of a suction conduit 656 made of multiple individual constituent tubes 656A, 656B, 656C, 656D, 656E, in accordance with some embodiments. The suction conduit 656 may be made of a number of constituent tubes, such as five tubes, in certain embodiments. Each of the constituent tubes 656A, 656B, 656C, 656D, 656E may be collected within an outer casing 670. These multiple constituent tubes 656A, 656B, 656C, 656D, 656E may make the application of vacuum force more even at an end of the suction conduit than if the suction conduit included only a single opening.

Figure 8:
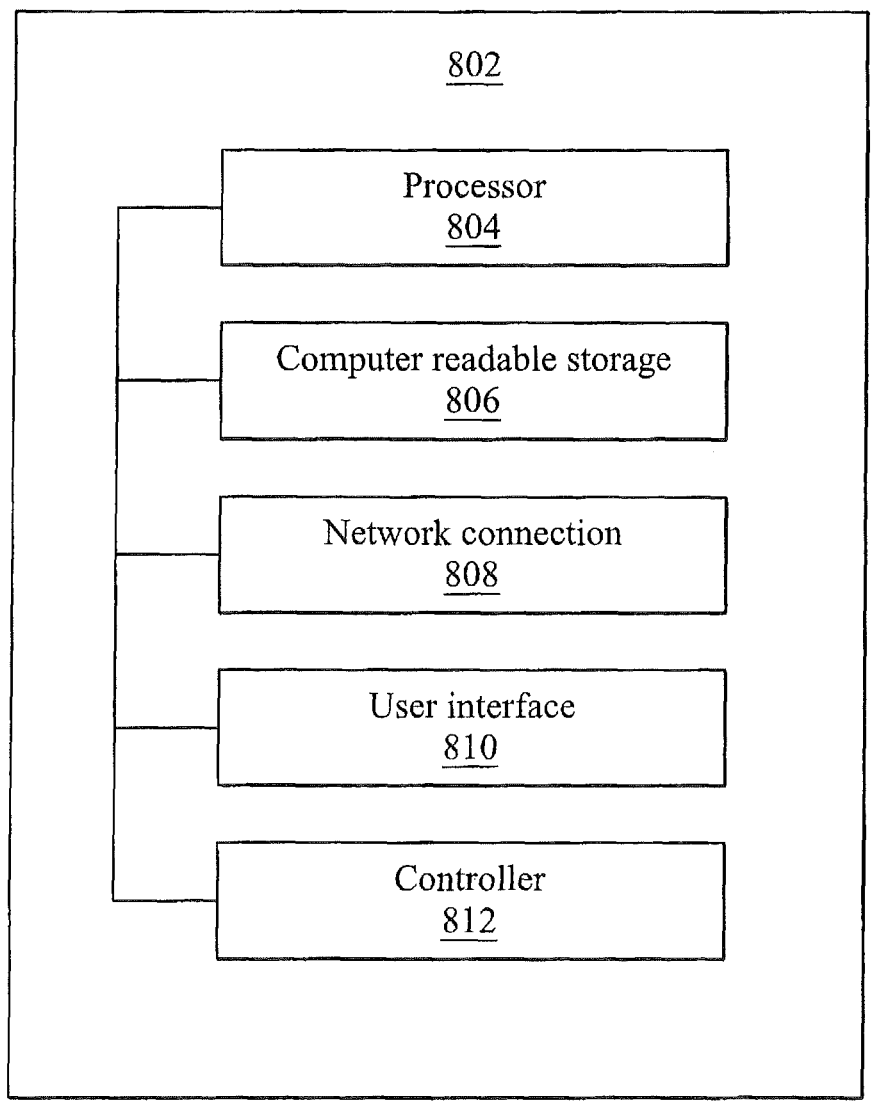
FIG. 8 is a block diagram of various functional modules of an integrated semiconductor die parceling platform functional module, in accordance with some embodiments.

FIG. 8 is a block diagram of various functional modules of an integrated semiconductor die parceling platform functional module 802, in accordance with some embodiments. The integrated semiconductor die parceling platform functional module 802 may be part of an integrated semiconductor die parceling platform. The integrated semiconductor die parceling platform functional module 802 may include a processor 804. In further embodiments, the processor 804 may be implemented as one or more processors.

The processor 804 may be operatively connected to a computer readable storage module 806 (e.g., a memory and/or data store), a network connection module 808, a user interface module 810, and a controller module 812. In some embodiments, the computer readable storage module 806 may include logic that may configure the processor 804 to perform the various processes discussed herein. The computer readable storage may also store data, such as sensor data collected by an image sensor of an inspection station, image data for identifying a defect, identifiers for a die, identifiers for a die vessel, identifiers for a die container, identifiers for an image sensor, and any other parameter or information that may be utilized to perform the various processes discussed herein.

The network connection module 808 may facilitate a network connection of the integrated semiconductor die parceling platform with various devices and/or components of the workstation that may communicate within or external to the integrated semiconductor die parceling platform functional module 802. In certain embodiments, the network connection module 808 may facilitate a physical connection, such as a line or a bus. In other embodiments, the network connection module 808 may facilitate a wireless connection, such as over a wireless local area network (WLAN) by using a transmitter, receiver, and/or transceiver. For example, the network connection module 808 may facilitate a wireless or wired connection with various parts of the integrated semiconductor die parceling platform.

The integrated semiconductor die parceling platform functional module 802 may also include the user interface module 810. The user interface module 810 may include any type of interface for input and/or output to an operator of the integrated semiconductor die parceling platform, including, but not limited to, a monitor, a laptop computer, a tablet, or a mobile device, etc.

The integrated semiconductor die parceling platform functional module 802 may include a controller module 812. In certain embodiments, the controller module 812 may be implemented by (e.g., be part of) the processor 804. The controller module 812 may be configured to control various physical apparatuses that control movement or functionality of the integrated semiconductor die parceling platform, such as the conveyor system. For example, the controller module 412 may be configured to control movement or functionality for at least one of a conveyor belt, robotic at in, and the like. For example, the controller module 412 may control a motor that may move at least one of a conveyor belt and/or a robotic arm. The controller module 412 may be controlled by the processor 804 and may carry out the various aspects of the various processes discussed herein.

In certain embodiments, a system includes: an inspection station configured to receive a die vessel, wherein the inspection station is configured to inspect the die vessel for defects; a desiccant station configured to receive the die vessel from the inspection station, wherein the desiccant station is configured to add a desiccant to the die vessel; a bundle station configured to receive the die vessel from the desiccant station, wherein the bundle station is configured to combine the die vessel with another die vessel as a die bundle; and a bagging station configured to receive the die bundle from the bundle station, wherein the bagging station is configured to dispose the die bundle in a die bag and to heat seal the die bag with the die bundle inside.

In certain embodiments, a system includes: an inspection station configured to receive a die vessel, wherein the inspection station is configured to inspect the die vessel for defects; a bundle station configured to receive the die vessel from the inspection station, wherein the bundle station is configured to combine the die vessel with another die vessel as a die bundle; a bagging station configured to receive the die bundle from the bundle station, wherein the bagging station is configured to: dispose the die bundle in a die bag; create a vacuum within the die bag; and heat seal the die bag with the die bundle in a vacuum environment inside; and a folding station configured to receive the die bag from the bagging station, wherein the folding station configured to fold the die bag into an outport car.

In certain embodiments, a method includes: receiving a die vessel at an inspection station, wherein the inspection station is configured to inspect the die vessel for defects; receiving the die vessel, from the inspection station, at a bundle station, wherein the bundle station is configured to combine the die vessel with another die vessel as a die bundle; and receiving the die bundle, from the bundle station, at a bagging station, wherein the bagging station is configured to dispose the die bundle in a die bag and to heat seal the die bag with the die bundle inside.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
   receiving a die vessel;
   inspecting the die vessel for defects utilizing an image sensor;
   adding a desiccant to the die vessel;
   stacking the die vessel with at least one other die vessel to form a plurality of die vessels stacked on top of one another and configured to be secured together via a harness;
   placing the plurality of die vessels in a die bag and thereafter heat sealing the die bag; and
   folding the die bag and thereafter depositing the folded die bag onto one of a plurality of shelves of an outport car, wherein the outport car transports the folded die bag from the system.

2. The method of claim 1, further comprising printing a bar code on the die bag.

3. The method of claim 1, wherein the outport car comprises wheels and is configured to be wheeled from the folding station.

4. The method of claim 1, further comprising:
   storing die vessels received at a load port on buffer shelves, wherein an inspection station is configured to receive the die vessels from the buffer shelves.

5. The method of claim 1, wherein the inspecting comprises inspecting the die vessel for a number of dies and die quality.

6. The method of claim 1, further comprising:
   creating a vacuum within the die bag; and
   heat sealing the die bag with the die bundle in a vacuum environment inside.

7. The method of claim 1, further comprising moving the harness over the stacked one or more die vessels and then tightening the harness over the stacked one or more die vessels to cause the die vessels to adhere together.

8. The method of claim 1, wherein each die bag is folded at a folding station so that each die bag fits within one of the respective shelves of an outport car and are separated vertically from each other.

9. The method of claim 1, wherein if a defect in the die vessel is detected, moving the die vessel to a remediation location for remediation.

* * * * *